(12) United States Patent
Krems et al.

(10) Patent No.: US 9,294,065 B2
(45) Date of Patent: Mar. 22, 2016

(54) REACTANCE FILTER COMPRISING SUPPRESSION IN THE STOP BAND AND DUPLEXER COMPONENT

(75) Inventors: Tobias Krems, München (DE);
Wolfgang Till, San Diego, CA (US);
Ravi Challa, Rancho Santa Margarita, CA (US)

(73) Assignee: EPCOS AG, Munich (DE)

(*) Notice: Subject to any disclaimer, the term of this patent is extended or adjusted under 35 U.S.C. 154(b) by 225 days.

(21) Appl. No.: 13/995,941

(22) PCT Filed: Dec. 16, 2011

(86) PCT No.: PCT/EP2011/073133
§ 371 (c)(1),
(2), (4) Date: Sep. 6, 2013

(87) PCT Pub. No.: WO2012/084741
PCT Pub. Date: Jun. 28, 2012

(65) Prior Publication Data
US 2014/0010122 A1    Jan. 9, 2014

(30) Foreign Application Priority Data
Dec. 22, 2010   (DE) .......................... 10 2010 055 669

(51) Int. Cl.
*H03H 7/01*    (2006.01)
*H03H 9/64*    (2006.01)
*H03H 9/72*    (2006.01)
(Continued)

(52) U.S. Cl.
CPC ........... *H03H 7/0115* (2013.01); *H03H 9/6483* (2013.01); *H03H 9/725* (2013.01); *H03H 9/605* (2013.01); *H03H 9/706* (2013.01)

(58) Field of Classification Search
CPC ... H03H 7/0115; H03H 9/6483; H03H 9/725; H03H 9/605; H03H 9/706
USPC ........................................................ 370/277
See application file for complete search history.

(56) References Cited

U.S. PATENT DOCUMENTS

| | | |
|---|---|---|
| 2002/0158708 A1 | 10/2002 | Inoue et al. |
| 2004/0075362 A1 | 4/2004 | Inoue et al. |
| 2005/0190015 A1 | 9/2005 | Komazaki |

(Continued)

FOREIGN PATENT DOCUMENTS

| | | |
|---|---|---|
| EP | 1860773 A2 | 11/2007 |
| EP | 2228904 A1 | 9/2010 |

(Continued)

*Primary Examiner* — Melvin Marcelo
(74) *Attorney, Agent, or Firm* — McDermott Will & Emery LLP

(57) ABSTRACT

A reactance filter comprising suppression in the stop band comprises an input connection for applying an input signal, an output connection for outputting an output signal, at least series resonator, which is connected in a signal path between the input connection and the output connection, a parallel resonator, which is connected between the signal path and a connection in order to apply a reference potential, and an inductor, which is connected in series to the parallel resonator. A capacitor is connected by means of one connection between the at least one parallel resonator and the inductor and by means of the additional connection to the output connection. By connecting the reactance filter as a transmission filter in a duplexer component, the isolation in the receiving band of the duplexer component can be improved.

9 Claims, 7 Drawing Sheets

Figure 1:
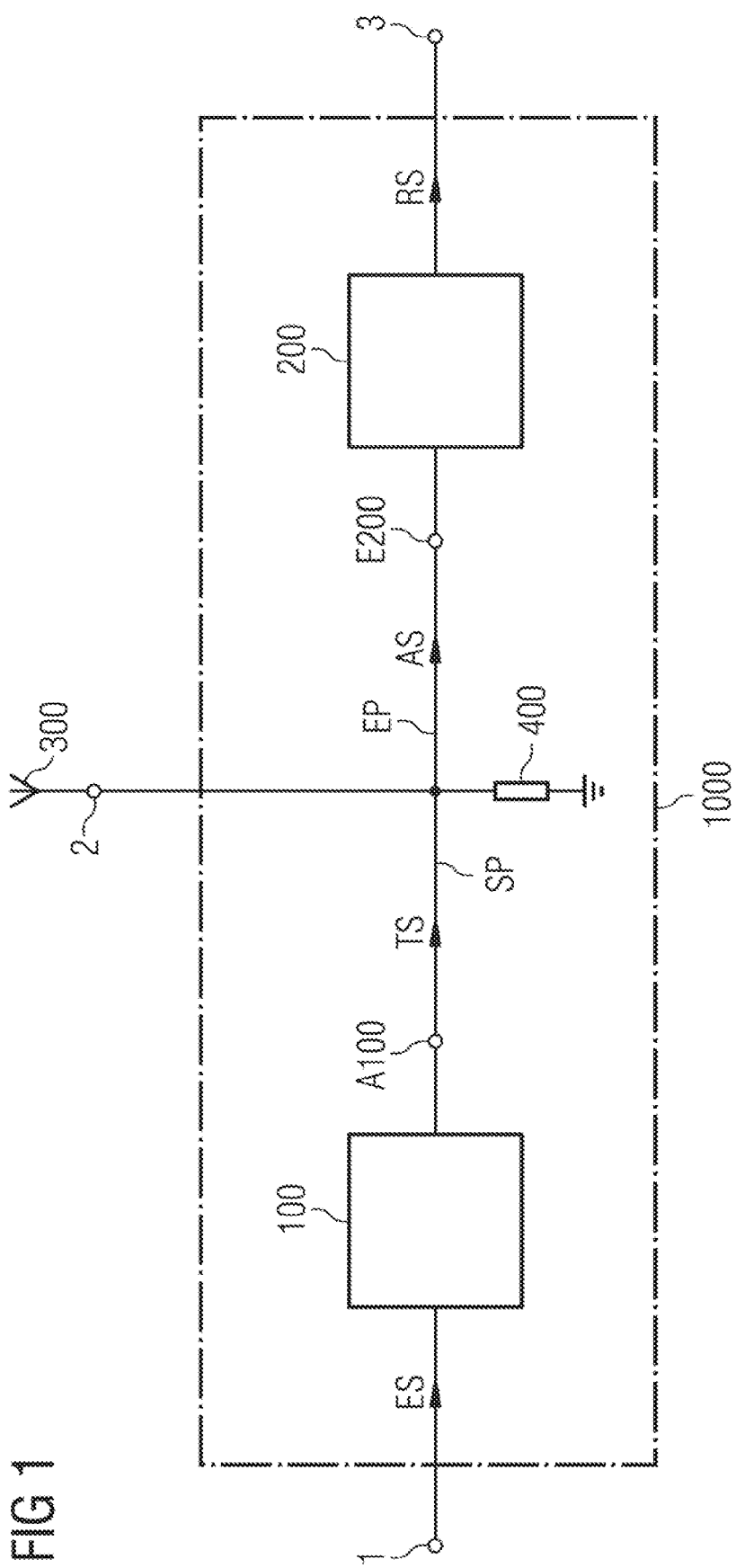

(51) Int. Cl.
   *H03H 9/60*   (2006.01)
   *H03H 9/70*   (2006.01)

(56) References Cited

U.S. PATENT DOCUMENTS

2010/0188166 A1   7/2010   Hara et al.
2010/0225418 A1*  9/2010   Kawamoto et al. ........... 333/133
2014/0111287 A1   4/2014   Hara et al.

FOREIGN PATENT DOCUMENTS

| JP | 02177712 A | 7/1990 |
| JP | 2002330055 A | 11/2002 |
| JP | 2010154437 A | 7/2010 |
| JP | 2010177770 A | 8/2010 |
| JP | 2010192974 A | 9/2010 |
| JP | 2010206375 A | 9/2010 |
| JP | 2010239612 A | 10/2010 |

* cited by examiner

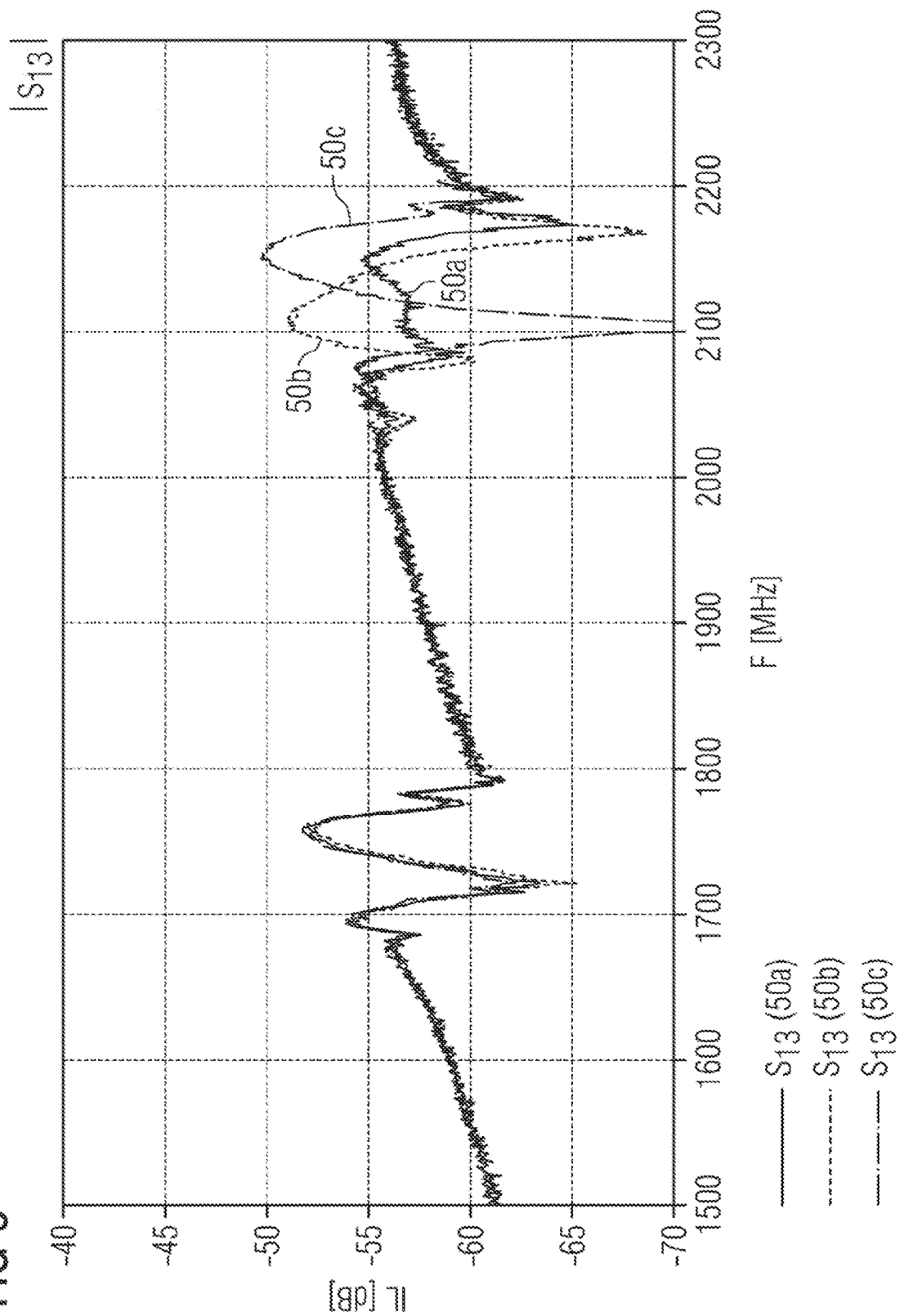

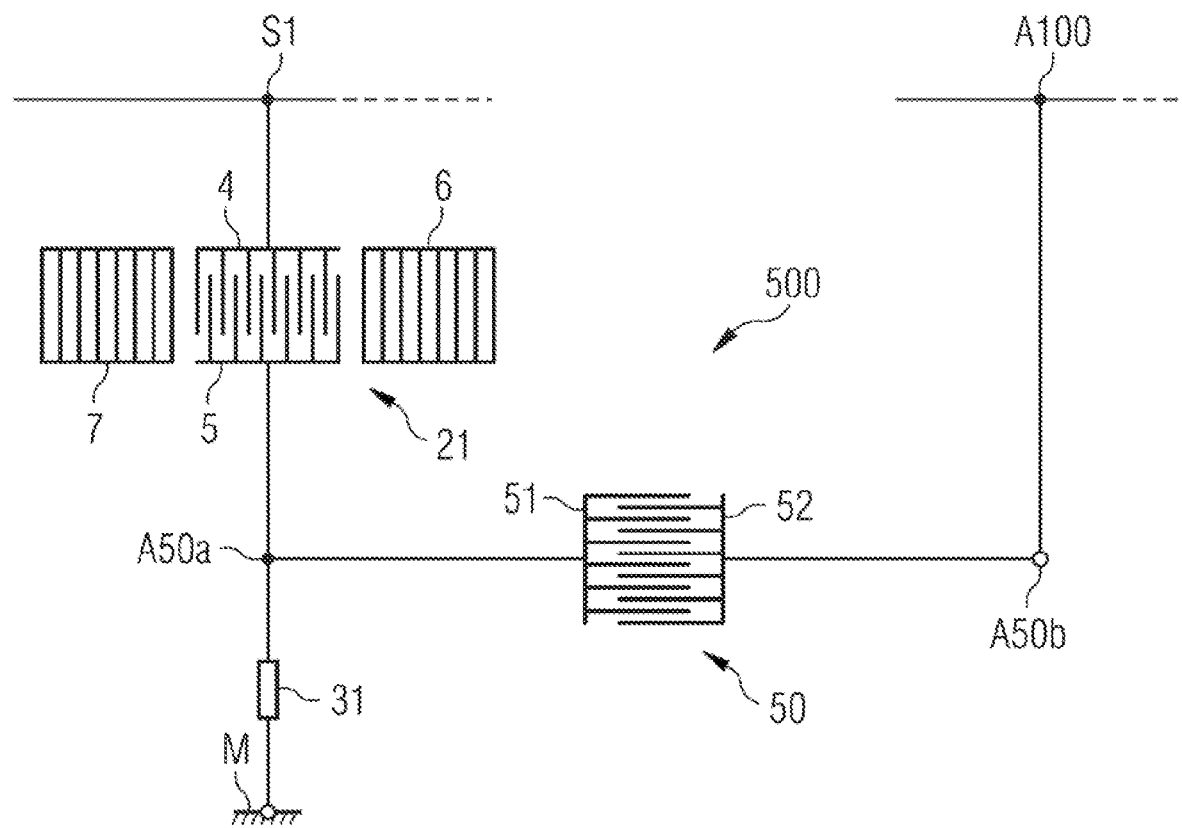

REACTANCE FILTER COMPRISING SUPPRESSION IN THE STOP BAND AND DUPLEXER COMPONENT

The invention relates to a reactance filter comprising suppression in the stop band. The invention furthermore relates to a duplexer component, in particular an antenna duplexer, comprising a reactance filter in the transmission and/or reception path of the duplexer component.

A duplexer component, in particular an antenna duplexer, can have a transmission path and reception path, which are in each case connected to a common connection of the duplexer component for connecting a transceiver. A transmission filter can be provided in the transmission path of the duplexer component, said filter having a passband in the range of the frequencies of the transmission signal. A reception filter can be provided in the reception path of the duplexer component, said filter having a passband in the range of the frequencies of the signal received by the reception component. In order to prevent a signal having frequencies in the passband of the reception filter from being coupled from the transmission path into the reception path and being transferred by the reception filter to an output connection of the reception path, a high signal suppression of the transmission filter for frequencies in the passband of the reception filter is necessary.

In a duplexer component, an interference signal can be coupled from the transmission path into the reception path on various transfer paths within the duplexer component. By way of example, a signal at the output connection of the reception filter can be transferred directly between the transmission path and the reception path on account of the direction connection of the transmission and reception paths. An indirect signal transfer path runs from the input connection of the transmission filter via the transmission path firstly as far as the connection for connecting the transceiver component and from there via the reception path to the output connection of the reception filter.

Particularly for the signal transfer section mentioned last, the isolation between the transmission and reception paths for signals having frequencies in the reception band of a duplexer is provided by the product of the suppression in the stop band of the transmission filter and in the insertion loss in the passband of the reception filter. In order to obtain a high isolation, the insertion loss in the passband of the reception filter could be increased. Furthermore, the suppression of signals in the stop band of the transmission filter could be improved, but this generally results in a worsening of the insertion loss of the transmission filter. Both possibilities mentioned are thus associated with significant disadvantages since the insertion loss in the passband of the reception filter and the insertion loss in the passband of the transmission filter are inevitably increased.

It is desirable to specify a reactance filter comprising suppression in the stop band whereby the transfer of an interference signal having frequencies in the stop band of the reactance filter is suppressed to the greatest possible extent. Furthermore, the intention is to specify a duplexer component comprising such a reactance filter, wherein the duplexer component has a high isolation between a transmission path and a reception path.

One possible embodiment of a reactance filter comprises an input connection for applying an input signal, an output connection for outputting an output signal, at least one series resonator, which is connected into a signal path between the input connection and the output connection, a parallel resonator, which is connected between the signal path and a connection for applying a reference potential, an inductance, which is connected in series with the parallel resonator, and a capacitor having a connection and a further connection, wherein the connection of the capacitor is connected between the at least one parallel resonator and the inductance and the further connection of the capacitor is connected to the output connection.

The reactance filter can be used as a transmission filter in the duplexer component. By virtue of the fact that the capacitor is connected by one connection between a parallel resonator and an inductance connected relative to a reference voltage connection and is connected by the other connection to an output connection of the reactance filter of the duplexer component, which is connected to an antenna, it is possible to improve the isolation between a transmission path and reception path of the duplexer component in the reception band.

In accordance with one possible configuration, the duplexer component comprises a reactance filter according to the embodiment specified above and a further reactance filter comprising an input connection for applying a further input signal and comprising an output connection for outputting a further output signal. Furthermore, a connection for connecting a transceiver component is provided. The output connection of the reactance filter and the input connection of the further reactance filter are in each case connected to the connection for connecting the transceiver component.

Further embodiments of the reactance filter and of the duplexer component can be gathered from the dependent claims.

The invention is explained in greater detail below with reference to figures showing exemplary embodiments of the present invention.

Figure 2:
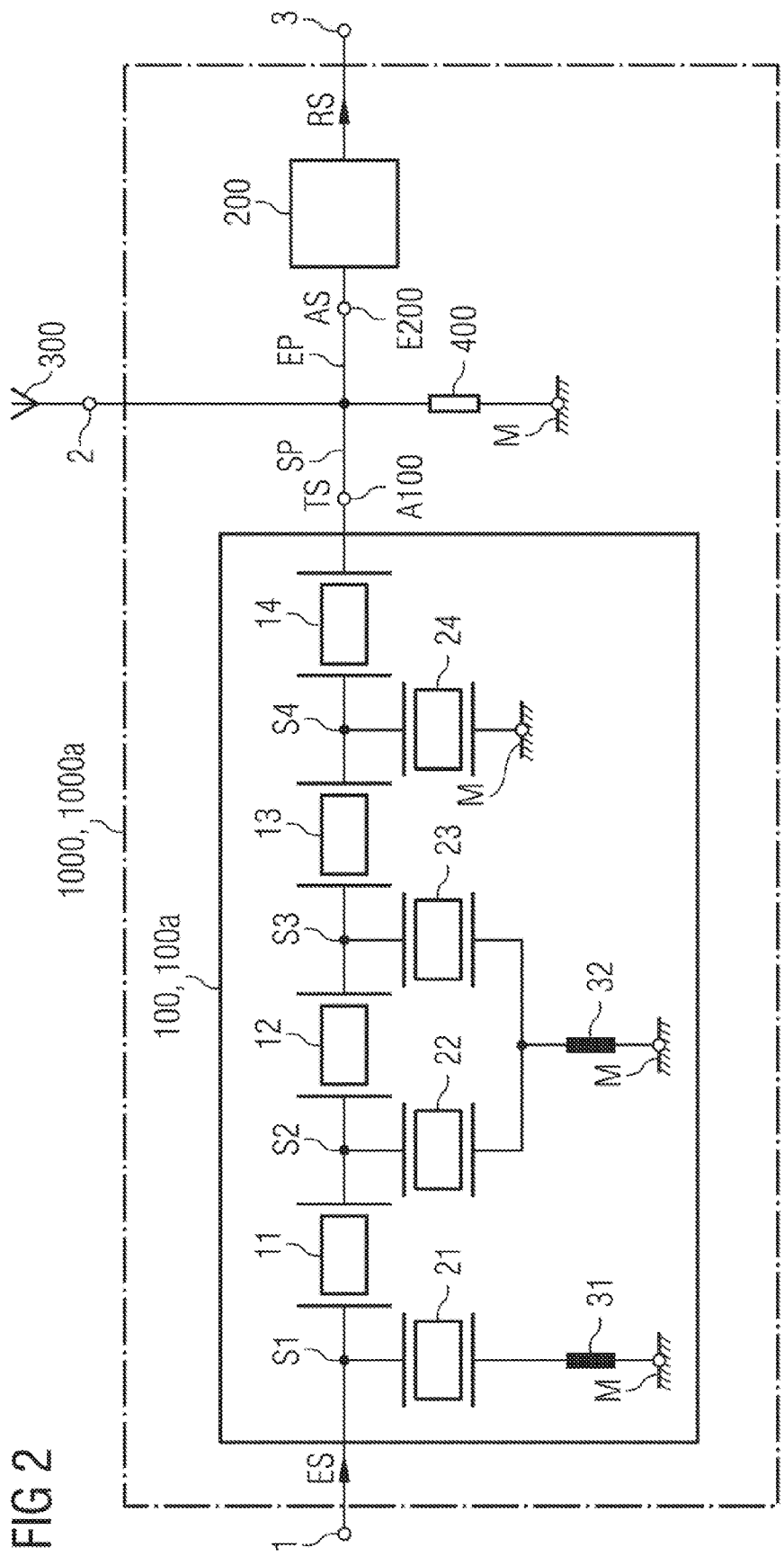
Figure 3:
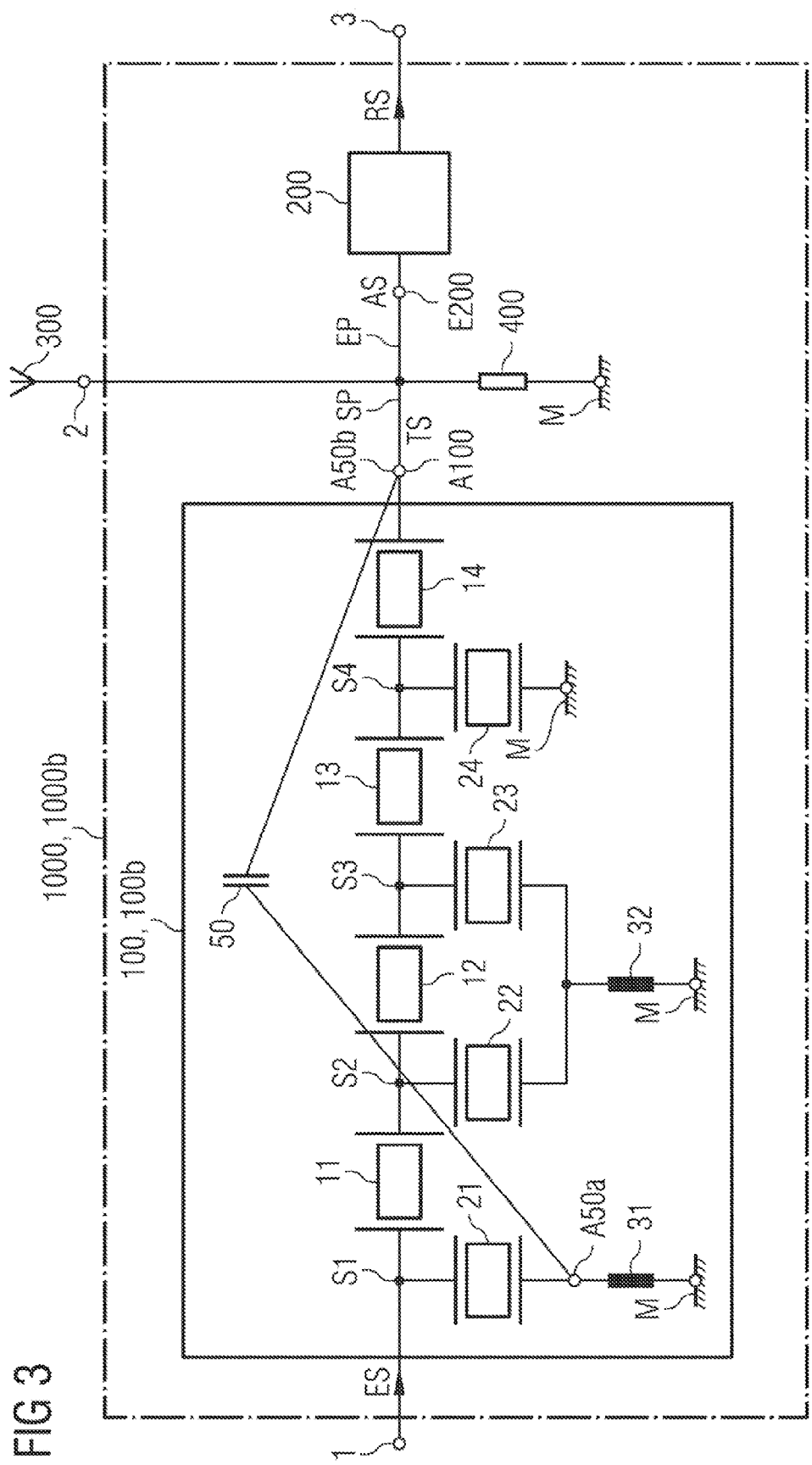
Figure 4:
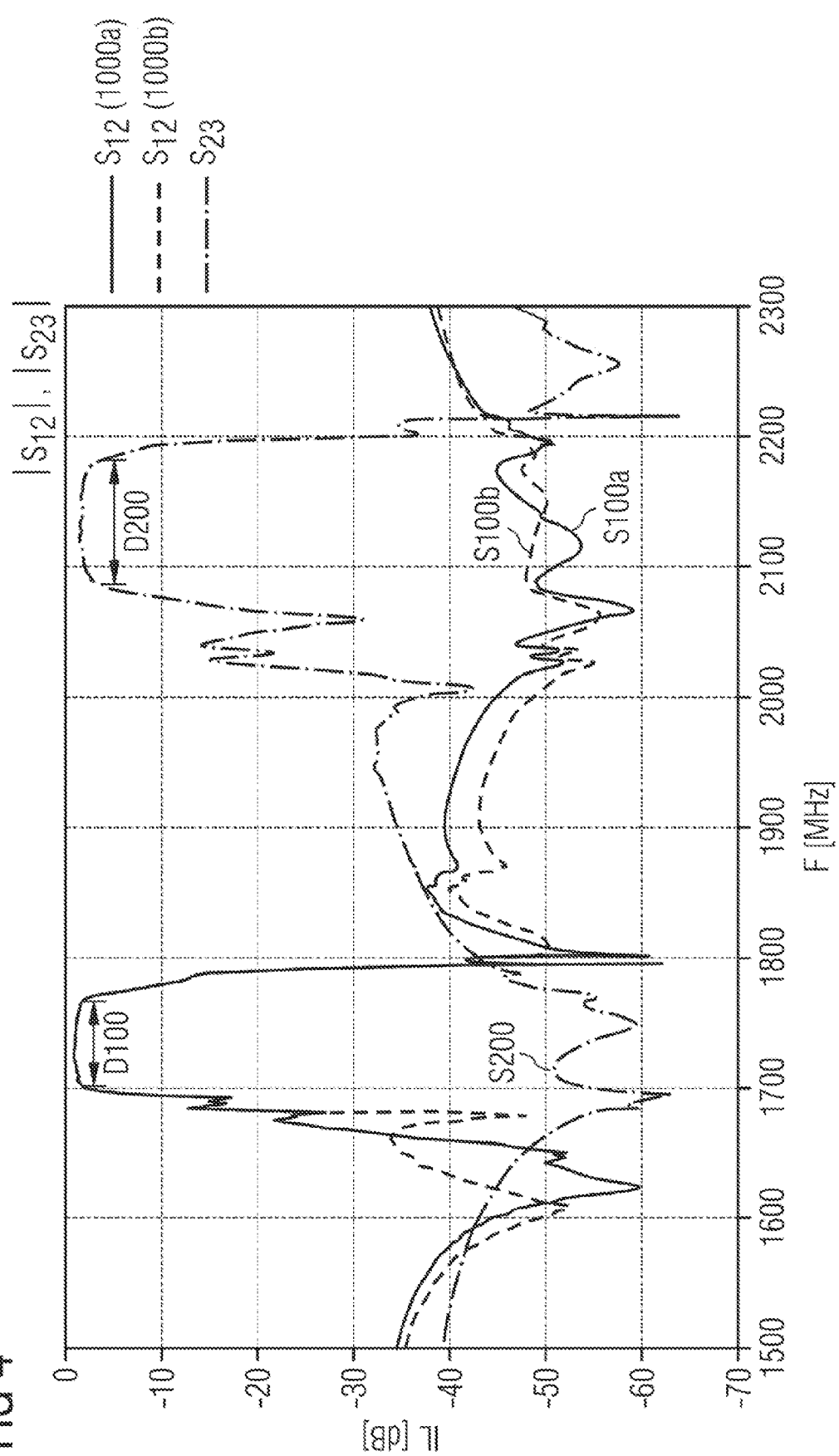
Figure 5:
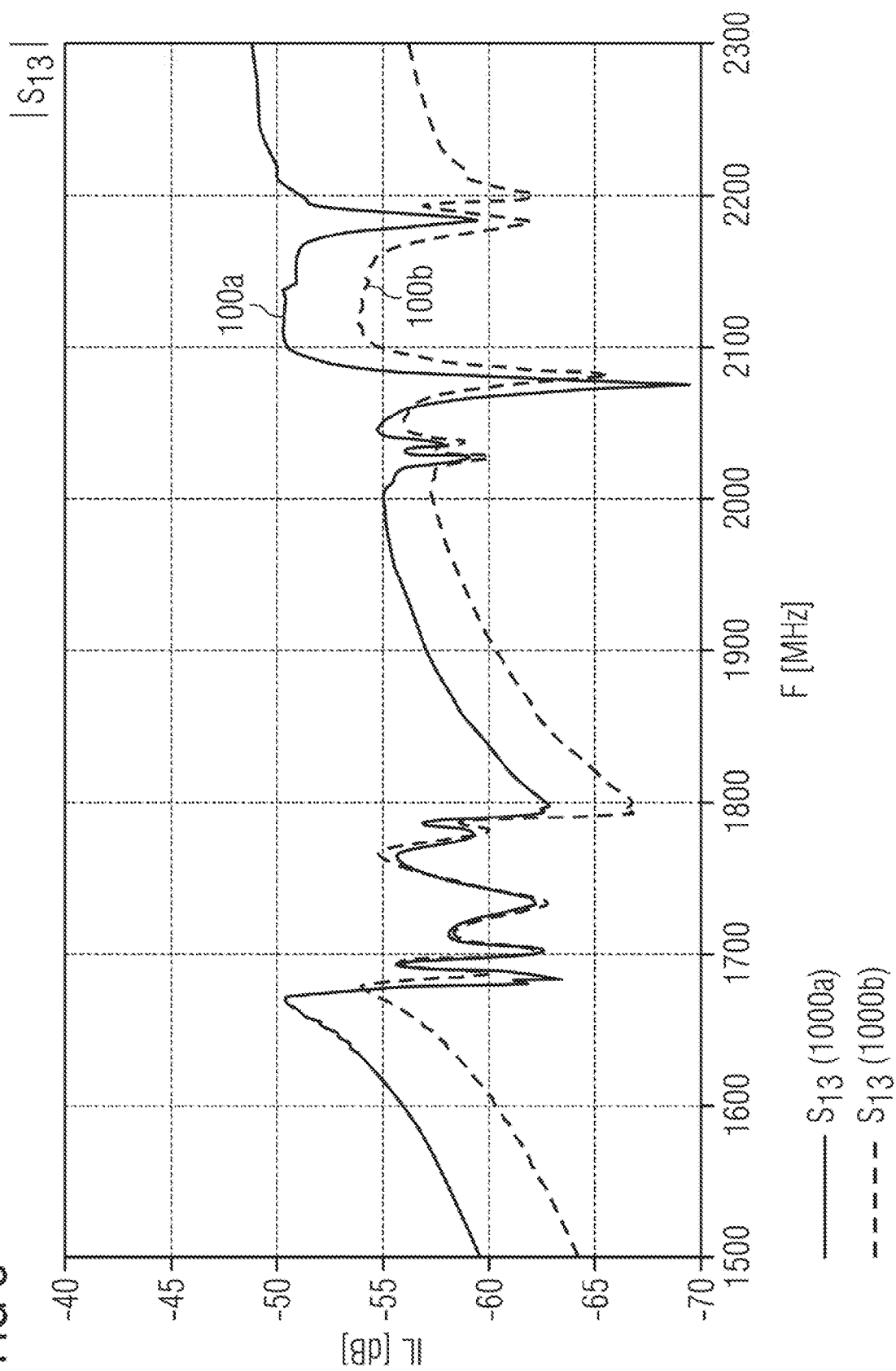

In the figures:

FIG. 1 shows an embodiment of a duplexer component,

FIG. 2 shows an embodiment of a reactance filter for use in a duplexer component, FIG. 3 shows a further embodiment of a reactance filter for use in a duplexer component, FIG. 4 shows transfer functions for characterizing a transfer response of signals in a duplexer component, FIG. 5 shows further transfer functions for characterizing a transfer response of signals in a duplexer component, FIG. 6 shows transfer functions for characterizing a signal transfer in a duplexer component upon variation of a reactance filter connected up to a capacitor, FIG. 7 shows an embodiment of transducer structures and of a capacitor on a carrier substrate of a reactance filter.

FIG. 1 shows an embodiment of a duplexer component 1000, in particular of an antenna duplexer. The duplexer component has a signal path SP, which serves as a transmission path SP and is connected between an input connection 1 for applying an input signal ES and an output connection 2 for connecting a transceiver component. By way of example, a transmitter can be connected to the input connection 1, which transmitter applies a transmission signal as input signal ES to the input connection 1 of the duplexer component. A filter 100, for example a reactance filter, is provided in the transmission path SP. The reactance filter is embodied in such a way that a filter effect is obtained by the conversion of an electrical signal into an acoustic signal and by renewed conversion of the acoustic signal back into an electrical signal. The reactance filter 100 generates an output signal TS at an output connection A100, said output signal being fed for emission to the connection 2 for connecting the transceiver component.

By way of example, an antenna 300 as transceiver component can be connected to the connection 2. An impedance 400 acts as a phase shifter that achieves matching between transmission path, reception path and antenna.

The duplexer component 1000 furthermore has an output connection 3, which is connected by a reception path EP to the connection 2 for connecting the transceiver component. A reception filter 200 is provided in the reception path, which filter can likewise be embodied as a reactance filter. The reactance filter has an arrangement of transducers by which an electrical input signal is converted into an acoustic signal and the acoustic signal is converted back again into an electrical signal, wherein a filter effect occurs between the input connection E200 of the reception filter 200 and the output connection 3 of the duplexer component. A signal AS received by the antenna 300 is therefore converted into an output signal RS, wherein the signal amplitude or damping of the filter 200 is dependent on the frequency of the antenna signal AS.

FIG. 2 shows an embodiment 1000*a* of the duplexer component 1000. In the embodiment 1000*a*, the duplexer component comprises the reactance filter 100 as a transmission filter in an embodiment 100*a*. The reactance filter has an input connection 1 for applying an input signal ES. At an output connection A100, an output signal TS is output by the filter 100 in reaction to the input signal ES, wherein the amplitude of the output signal TS is dependent on the frequency of the input signal ES. At specific frequencies in the passband of the reactance filter, the filter has a low insertion loss, whereas the filter has a high insertion loss and thus a suppression for reception signals having frequencies in the stop band of the filter.

In the embodiment 100*a* the reactance filter comprises series resonators 11, 12, 13 and 14, which are connected in series in a signal path SP between the input connection 1 and the output connection A100 of the reactance filter. Furthermore, the reactance filter comprises parallel resonators 21, 22, 23 and 24, which are arranged between the signal path SP and a connection M for applying a reference potential. The connection M can be embodied as a connection for applying a ground potential.

The parallel resonator 21 is connected to the signal path SP at a location S1. The location S1 is situated between the input connection 1 and the series resonator 11. Furthermore, the parallel resonator 21 is connected via an inductance 31 to the connection M for applying the reference potential. The parallel resonator 22 is connected at a location S2 of the signal path SP between the series resonator 11 and the series resonator 12. The parallel resonator 23 is connected to the signal path SP at a location S3 of the signal path between the series resonator 12 and the series resonator 13. Both parallel resonators 22 and 23 are connected via an inductance 32 to the connection M for applying the reference potential. By means of suitable dimensioning of the inductances 31 and 32, poles of the filter curve of the reactance filter which are predefined by the transducer track of the reactance filter can be shifted to specific frequencies. A further parallel resonator 24 is connected to the signal path SP at a location S4 of the signal path between the series resonator 13 and the series resonator 14 and is directly connected to the connection M for applying the reference potential.

The junction point between transmission and reception paths SP, EP and the antenna 300 is connected via an impedance 400, which acts as a phase shifter, to the connection M for applying the reference potential.

The reception path EP is embodied as explained with reference to FIG. 1 and comprises the reception filter 200, to which the signal AS received by the antenna 300 is fed at an input connection E200 and which generates the output signal RS in a frequency-dependent manner at the output connection 3. The reception filter 200 can likewise be embodied as a reactance filter comprising an arrangement of series and parallel resonators which are connected between the input connection E200 and the output connection 3 in a manner similar to that in the case of the transmission filter.

FIG. 3 shows a further embodiment 1000*b* of the duplexer component 1000. In the embodiment 1000*b*, the duplexer component comprises the transmission filter 100 in an embodiment 100*b*. In the configuration 100*b*, the transmission filter 100 is likewise embodied again as a reactance filter. The reactance filter 100 is connected between an input connection 1 for applying an input signal ES and an output connection A100 in a transmission path SP as in the case of the embodiment shown in FIG. 2. At the input connection 1, a transmitter can provide the input signal ES as the transmission signal. The output signal TS is output at the output connection A100 of the reactance filter. The reactance filter is embodied in such a way that the amplitude of the output signal TS is dependent on the frequency of the input signal ES.

In the transmission path SP, the series resonators 11, 12, 13 and 14 are connected in series one after another between the input connection 1 and the output connection A100. The reactance filter furthermore comprises parallel resonators 21, 22, 23 and 24, which are in each case connected between the transmission path SP and a connection M for applying a reference potential. The connection M for applying the reference potential can be embodied as a connection for applying a ground potential. The parallel resonator 21 is connected to the signal path SP at a location S1 of the transmission path between the input connection 1 and the series resonator 11. Furthermore, the parallel resonator 21 is connected via an inductance 31 to the connection M for applying the reference potential. A further parallel resonator 22 is connected at a location S2 of the transmission path SP between the series resonator 11 and the series resonator 12. The parallel resonator 23 is connected to the transmission path SP at a location S3 of the transmission path between the series resonator 12 and the series resonator 13. The two parallel resonators 22 and 23 are jointly connected via an inductance 32 to the connection M for applying the reference potential. By means of suitable dimensioning of the inductances 31 and 32, poles of the filter curve of the reactance filter which are predefined by the transducer track of the reactance filter can be shifted to specific frequencies. The parallel resonator 24 is connected to the transmission path SP at a location S4 between the series resonator 13 and the series resonator 14. A further side of the parallel resonator 24 is connected to the connection M for connecting the reference potential.

Alongside the embodiment 100*b* of the reactance filter, FIG. 3 also shows the interconnection of the reactance filter 100 within the duplexer component 1000. The output connection A100 of the reactance filter 100 is connected to the connection 2 for connecting the transceiver component 300. In the reception path EP, the reception filter 200 is connected between the output connection 3 of the duplexer component and the connection 2 for connecting the transceiver component. The reception filter 200 can be embodied as a reactance filter.

In contrast to the embodiment shown in FIG. 2, a capacitor 50 is connected between a connection of the parallel resonator 21 to the inductance 31 and the output connection A100. A connection A50*a* of the capacitor 50 is connected between the parallel resonator 21 and the inductance 31. A further connection A50*b* of the capacitor is connected to the output connection A100 of the reactance filter.

That side of the capacitor which is connected between the series connection of the parallel resonator and the inductance is preferably connected to that parallel branch of the reactance filter which is closest to the input connection 1. In the exemplary embodiment, in FIG. 3, the capacitor 50 is connected for example between the connection of the parallel resonator 21 and the inductance 31. The location S1 at which the parallel branch comprising the parallel resonator 21 and the inductance 31 is connected to the transmission path SP is, for example, closer to the input connection 1 than the further locations S2, S3 and S4 at which the further parallel branches are connected to the transmission path SP.

By connecting the capacitor 50 between the parallel branch and the output connection of the reactance filter, it is possible to improve the isolation in the reception band between the input connection 1 and the output connection 3 of a duplexer component. The insertion loss in the passband of the transmission filter and the insertion loss in the passband of the reception filter remain virtually unchanged in comparison with an unconnected reactance filter of the embodiment 100a.

FIG. 4 shows transfer functions of the duplexer component, in particular a transfer function S12 for characterizing the signal transfer between the input connection 1 for applying the transmission signal ES and the connection 2 for connecting the antenna 300, and also a transfer function S23 for characterizing a signal transfer between the connection 2 for connecting the antenna 300 and the output connection 3 of the duplexer component. The profile of the insertion loss IL is plotted as a function of the signal frequency for the transfer path from input connection 1 to antenna connection 2 and for the transfer path from antenna connection 2 to output connection 3. The transfer functions S12 and S23 are in each case illustrated for the embodiment 100a and the embodiment 100b of the reactance filter 100.

Since the reception filter 200 is identical in the embodiments shown in FIGS. 2 and 3, no offset between the transfer functions of the embodiments 1000a and 1000b of the duplexer component occurs in the profile of the transfer function S23. In the exemplary embodiment shown, the reception filter 200 is embodied in such a way that the passband D200 of the reception filter lies in the frequency range between 2080 MHz and 2180 MHz. Outside the passband D200, the reception filter 200 has a stop band S200 having a higher insertion loss than the passband D200.

Both in the embodiment 100a and in the embodiment 100b, the transmission filter 100 has a passband D100 in the range between 1690 MHz and 1770 MHz. The transfer functions S12 of the embodiment 100a of the reactance filter 100 and of the embodiment 100b of the reactance filter differ only insignificantly in the passband. Outside the passband D100, the transmission filter 100 in the embodiment 100a has a stop band, identified by S100a in FIG. 4. In the embodiment 100b, the stop band of the transmission filter 100 is identified by S100b in FIG. 4. In both embodiments of the reactance filter 100, the insertion loss is significantly increased in comparison with the passband D100.

It can furthermore be discerned with reference to FIG. 4 that different values for the insertion loss IL occur, however, in the stop band S100a of the reactance filter of the embodiment 100a and in the stop band S100b of the reactance filter of the embodiment 100b. Despite the different levels for the insertion loss, the basic profile of the transfer function S12 for the reactance filters of the embodiments 100a and 100b nevertheless remains approximately identical.

FIG. 5 shows a transfer function S13 characterizing the signal transfer between the input connection 1 for applying the input signal ES and the output connection 3 for outputting the output signal RS. The illustration shows the insertion loss IL experienced by a signal between the input connection 1 and the output connection 3 as a function of the frequency of the signal. It becomes clear with reference to FIG. 5 that the transfer path between the input connection 1 and the output connection 3 with the use of a reactance filter 100 in the embodiment 100b for input signals ES having signal frequencies in the passband D200 of the reception filter 200, that is to say in the reception band, has a significantly higher insertion loss than the transfer path has if the reactance filter 100 is embodied in the configuration 100a.

The higher insertion loss between the input connection 1 and the output connection 3 for signals having frequencies in the passband of the reception filter prevents interference signals from being coupled into the reception path EP from the input connection 1, which interference signals would subsequently appear at the output connection 3. By providing a reactance filter in the embodiment 100b, it is thus possible to realize a duplexer component in which the isolation between transmission and reception paths for signals in the reception band is improved. It becomes clear with reference to FIG. 4 that in this case the insertion loss of the transmission filter in the passband of the transmission filter and the insertion loss of the reception filter in the passband of the reception filter remain low without change.

FIG. 6 shows the profile of the transfer function S13 for characterizing a signal transfer between the input connection 1 and the output connection 3 of the duplexer component for different capacitance values of the capacitor 50. In the case of an optimized capacitance value 50a, which lies for example in the range between 0.5 pF and 30 pF, a high insertion loss of approximately −55 dB is manifested in the reception band for the transfer path between the input connection 1 and the output connection 3.

When the capacitance value of the capacitor 50 is varied to a value 50b that is 25% below the optimized capacitance value, a significantly lower insertion loss occurs in the transfer path between the input connection 1 and the output connection 3 of the duplexer component. Likewise, a significantly lower insertion loss is also manifested in the case of a capacitance value 50c of the capacitor 50 that is 25% above the optimized capacitance value 50a. Consequently, a significantly poorer isolation between the input connection 1 and the output connection 3 occurs in the case of a deviation of the capacitance value of the capacitor 50 of +/−25% from the optimized capacitance value. A suitable capacitance value for the capacitor 50 lies in the range between approximately 0.5 pF and 50 pF. It is determined, in particular, by the value of the inductance 31 connected to the parallel resonator 21.

FIG. 7 shows a practical configuration of the parallel resonator 21 and of the capacitor 50 on a carrier substrate 500. The parallel resonator 21, like the further parallel resonators and also the series resonators, is embodied as a single-port resonator. It has an input transducer 4 and an output transducer 5, which are in each case arranged as comb-shaped, metallic structures on the carrier substrate 500. The carrier substrate 500 can contain, for example, a material composed of lithium tantalate, lithium niobate or quartz. The comb-shaped structures 4 and 5 of the input and output transducers are displaced in one another in such a way that the individual fingers of one comb engage into the interspaces between the fingers of the other comb. On both sides of the input and output transducers 4, 5, reflectors 6 and 7 are in each case provided on the carrier substrate 500. In accordance with the embodiment 100b of the reactance filter as shown in FIG. 3, the input transducer 4 of the parallel resonator 21 is connected to the location S1 of the transmission path SP. The output transducer 5 of the parallel resonator 21 is connected via the inductance 31 to the connection M for applying the reference potential.

The connection A50a of the capacitor 50 is connected between the connection of the output transducer 2 and the inductance 31. A further connection A50b of the capacitor 50 is connected to the output connection A100 of the reactance filter. The capacitor 50 is realized by a comb-shaped structure 51 and a comb-shaped structure 52, which are likewise arranged on the substrate 500. In a manner similar to the input and output transducers of the single-port resonators, the comb-shaped structures 51 and 52 each have a finger structure that engages into the interspaces between the fingers of the respective other structure.

In contrast to the structures of the parallel and series resonators, in particular of the input and output transducers 4, 5, and of the reflectors 6, 7, the comb-shaped structure 51 and the comb-shaped structure 52 of the capacitor 50 are arranged on the carrier substrate 500 in such a way that no acoustic wave is generated in the carrier substrate 500 when a voltage is applied to the respective structure 51, 52. For this purpose, the comb-shaped structures 51, 52 are arranged on the carrier substrate in a different orientation direction in comparison with the comb-shaped structures 4, 5 of the parallel and series resonators. The structures 51 and 52 can be arranged on the carrier substrate in a manner offset by 90° relative to the comb-shaped structures of the series and parallel resonators. Consequently, during the production of the reactance filter, the capacitor 50 can be formed together with the tracks of the parallel and series resonators on the carrier substrate 500 in a simple manner.

LIST OF REFERENCE SIGNS

1 Input connection
2 Connection for connecting the transceiver component
3 Output connection
4 Input transducer
5 Output transducer
6, 7 Reflectors
11, 12, 13, 14 Series resonators
21, 22, 23, 24 Parallel resonators
31, 32 Coils for generating poles
100 Reactance filter/transmission filter
100a,100b Embodiments of the transmission/reactance filter
200 Reception filter
300 Transceiver component
400 Matching impedance
500 Carrier substrate
1000 Duplexer component

We claim:

1. A reactance filter comprising suppression in the stop band, comprising:
an input connection for applying an input signal;
an output connection for outputting an output signal;
at least one series resonator, which is connected into a signal path between the input connection and the output connection;
a plurality of parallel resonators being respectively connected between the signal path and a connection for applying a reference potential, wherein the plurality of parallel resonators is respectively connected to the signal path at different locations,
wherein a first one of the parallel resonators is connected to the signal path at a first one of the different locations of the signal path and at least a second one of the parallel resonators is connected to the signal path at a second one of the different locations of the signal path, wherein the first location is arranged nearer to the input connection than the at least one second location, and wherein the at least one second location is arranged nearer to the output connection than the first location;
an inductance, which is exclusively connected in series with one of the parallel resonators; and
a capacitor having a connection and a further connection,
wherein the connection of the capacitor is connected between the first at least one parallel resonator and the inductance and the further connection of the capacitor is connected to the output connection.

2. The reactance filter according to claim 1, wherein the parallel resonator and the at least one series resonator each have a comb shaped structure, which are arranged on a carrier substrate,
wherein the capacitor is embodied as a comb shaped structure on the carrier substrate, and
wherein the comb shaped structure of a capacitor is arranged on the carrier substrate in a different direction than the comb shaped structure of the parallel resonator and of the at least one series resonator.

3. The reactance filter according to claim 2, wherein the comb shaped structure of the capacitor is arranged on the carrier substrate in such a way that no acoustic wave is excited in the carrier substrate when a voltage is applied to the comb shaped structure of the capacitor.

4. The reactance filter according to claim 2 or 3, wherein the comb shaped structure of the capacitor is arranged on the carrier substrate in a manner rotated by 90° relative to the respective comb shaped structure of the parallel resonator and of the at least one series resonator.

5. The reactance filter according to claim 1, wherein the at least one series resonator and the parallel resonator are embodied in each case as a single port resonator.

6. The reactance filter according to claim 1, wherein the carrier substrate comprises a material composed of lithium niobate or lithium tantalate or quartz.

7. The reactance filter according to claim 1, wherein the connection for applying the reference potential is embodied as a connection for applying a ground potential.

8. A duplexer component, comprising:
a reactance filter according to claim 1;
a further reactance filter comprising an input connection for applying a further input signal and comprising an output connection for outputting a further output signal; and
a connection for connecting a transceiver component,
wherein the output connection of the reactance filter and the input connection of the further reactance filter are in each case connected to the connection for connecting the transceiver component.

9. The duplexer component according to claim 8, wherein the connection for connecting the transceiver component is embodied as a connection for connecting an antenna.

* * * * *